United States Patent
Lee et al.

(10) Patent No.: US 11,450,532 B2
(45) Date of Patent: Sep. 20, 2022

(54) DEPOSITION OF SELF ASSEMBLED MONOLAYER FOR ENABLING SELECTIVE DEPOSITION AND ETCH

(71) Applicant: Lam Research Corporation, Fremont, CA (US)

(72) Inventors: Younghee Lee, Pleasanton, CA (US); Daniel Peter, Sunnyvale, CA (US); Samantha SiamHwa Tan, Newark, CA (US); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/611,074

(22) PCT Filed: Jun. 25, 2020

(86) PCT No.: PCT/US2020/039636
§ 371 (c)(1),
(2) Date: Nov. 12, 2021

(87) PCT Pub. No.: WO2020/264170
PCT Pub. Date: Dec. 30, 2020

(65) Prior Publication Data
US 2022/0208555 A1 Jun. 30, 2022

Related U.S. Application Data

(60) Provisional application No. 62/867,419, filed on Jun. 27, 2019.

(51) Int. Cl.
*H01L 21/311* (2006.01)
*H01L 21/02* (2006.01)
*H01L 21/033* (2006.01)

(52) U.S. Cl.
CPC .. *H01L 21/31116* (2013.01); *H01L 21/02164* (2013.01); *H01L 21/02211* (2013.01); *H01L 21/0337* (2013.01); *H01L 21/31144* (2013.01)

(58) Field of Classification Search
None
See application file for complete search history.

(56) References Cited

U.S. PATENT DOCUMENTS

| 10,062,578 B2 | 8/2018 | Zhang et al. |
| 2005/0001276 A1 | 1/2005 | Gao et al. |

(Continued)

FOREIGN PATENT DOCUMENTS

| KR | 2013-0066636 | 6/2013 |
| WO | 2017/176027 | 10/2017 |

OTHER PUBLICATIONS

International Search Report from International Application No. PCT/US2020/039636 dated Oct. 12, 2020.

(Continued)

*Primary Examiner* — Roberts P Culbert
(74) *Attorney, Agent, or Firm* — Beyer Law Group LLP

(57) ABSTRACT

A method for selectively etching a first region of a structure with respect to a second region of the structure is provided. The method comprises at least one cycle. Each cycle comprises selectively depositing an inhibitor layer on the first region of the structure, providing an atomic layer deposition over the structure, wherein the atomic layer deposition selectively deposits a mask on the second region of the structure with respect to the inhibitor layer, and selectively etching the first region of the structure with respect to the mask. The selectively depositing an inhibitor layer on the first region of the structure comprises providing an inhibitor layer gas and forming the inhibitor layer gas into inhibitor layer radicals, wherein the inhibitor layer radicals selec- (Continued)

tively deposit on the first region of the structure with respect to the second region of the structure.

20 Claims, 5 Drawing Sheets

(56) References Cited

U.S. PATENT DOCUMENTS

2005/0208778 A1   9/2005  Li et al.
2017/0178924 A1   6/2017  Chen et al.
2019/0027373 A1   1/2019  Kwon et al.
2019/0164758 A1*  5/2019  Su .......................... H01L 29/401

OTHER PUBLICATIONS

Written Opinion from International Application No. PCT/US2020/039636 dated Oct. 12, 2020.

* cited by examiner

US 11,450,532 B2

DEPOSITION OF SELF ASSEMBLED MONOLAYER FOR ENABLING SELECTIVE DEPOSITION AND ETCH

CROSS-REFERENCE TO RELATED APPLICATION

This application claims the benefit of priority of U.S. Application No. 62/867,419, filed Jun. 27, 2019, which is incorporated herein by reference for all purposes.

BACKGROUND

The disclosure relates to methods of forming semiconductor devices on a semiconductor wafer. More specifically, the disclosure relates to the selective etching of silicon oxide ($SiO_2$).

In forming semiconductor devices, silicon oxide may be selectively etched with respect to other silicon containing regions or other regions with a lower concentration of oxygen than silicon oxide. As feature sizes shrink, such selective etches are not selective enough, resulting in some etching of the other silicon containing regions. When too much other silicon containing regions is etched defects are increased. In order to increase etch selectivity the speed of the etch process may decrease. Such processes may cause throughput to be decreased to unacceptable levels.

With continued scaling of semiconductor devices, the distance between feature shrinks and the edge placement error of lithography becomes a significant issue. To alleviate this the industry has been adopting self aligned schemes, such as for the etching of contact holes. In this scheme, the placement of the contact hole can overlap with the gate spacer. As a result, the contact silicon oxide-etch needs to be selective to the spacer material. At the same time, the material budget is shrinking. The shrinking budget increases the selectivity requirement of targeted etch vs. remaining (untouched material). Conventional fluorocarbon ($C_xF_y$)/Ar based silicon oxide atomic layer etching has shown a path higher material selectivity but still suffers from an initial loss of tens of angstroms (Å).

SUMMARY

To achieve the foregoing and in accordance with the purpose of the present disclosure, a method for selectively etching a first region of a structure with respect to a second region of the structure is provided. The method comprises at least one cycle. Each cycle comprises selectively depositing an inhibitor layer on the first region of the structure, providing an atomic layer deposition over the structure, wherein the atomic layer deposition selectively deposits a mask on the second region of the structure with respect to the inhibitor layer, and selectively etching the first region of the structure with respect to the mask. The selectively depositing an inhibitor layer on the first region of the structure comprises providing an inhibitor layer gas and forming the inhibitor layer gas into inhibitor layer radicals, wherein the inhibitor layer radicals selectively deposit on the first region of the structure with respect to the second region of the structure.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EXEMPLARY EMBODIMENTS

The present disclosure will now be described in detail with reference to a few exemplary embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

During the fabrication of semiconductor devices, a region of a structure may be selectively etched with respect to a second region of the structure. Sometimes a region with a lower atomic concentration of oxygen is selectively etched with respect to a region with a higher atomic concentration of oxygen. For example, a silicon oxide ($SiO_2$) region may be selectively etched with respect to regions with lower atomic concentrations of oxygen, such as a silicon region or a low-k dielectric region. Various methods of etching $SiO_2$ with respect to silicon (Si) have been used. However, as semiconductor features shrink there is a need for increased selectivity. As features shrink, even etching small amounts of the lower oxygen concentration regions increases defects.

Figure 1:
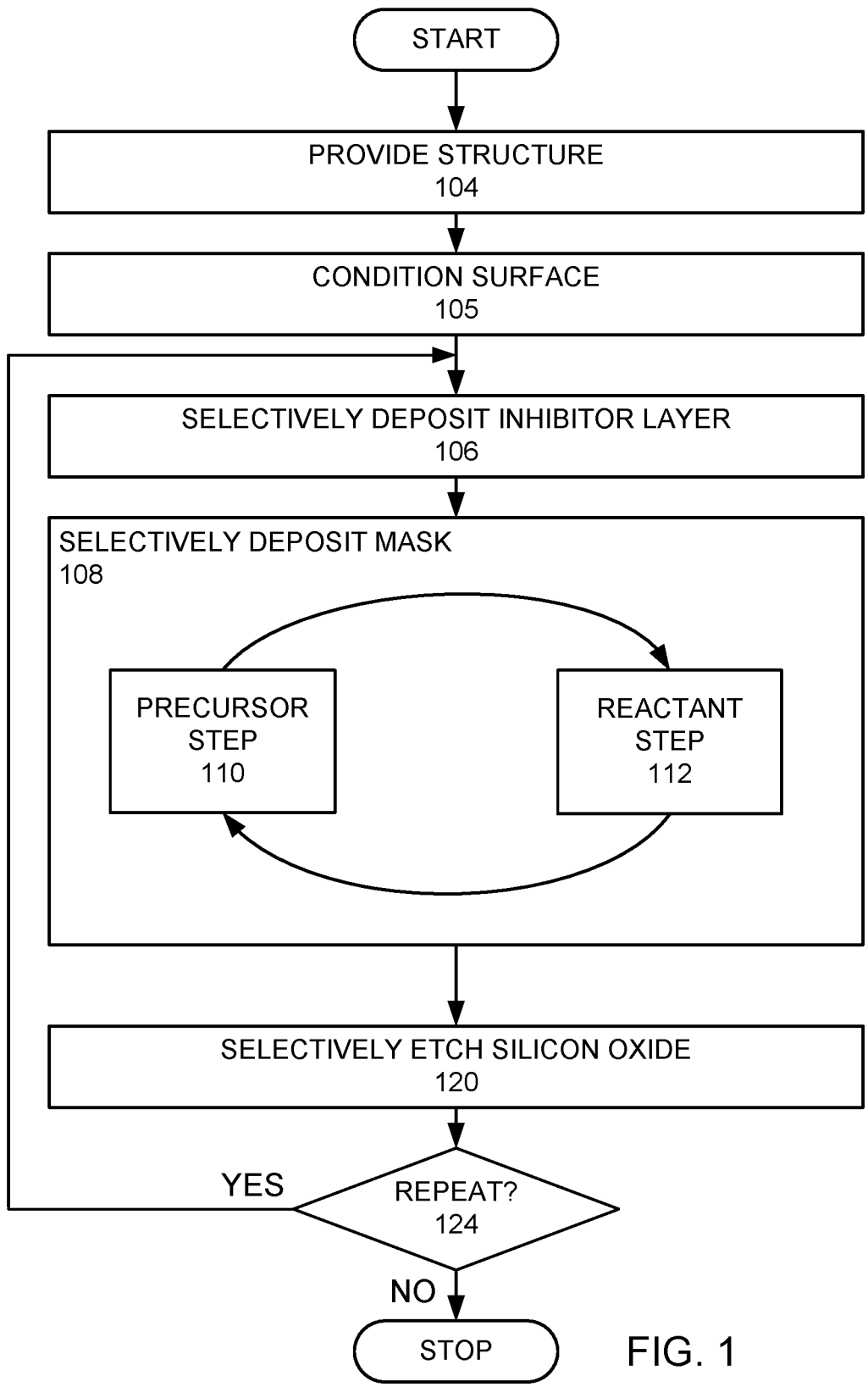
FIG. 1 is a high level flow chart of an embodiment.
Figure 2A:
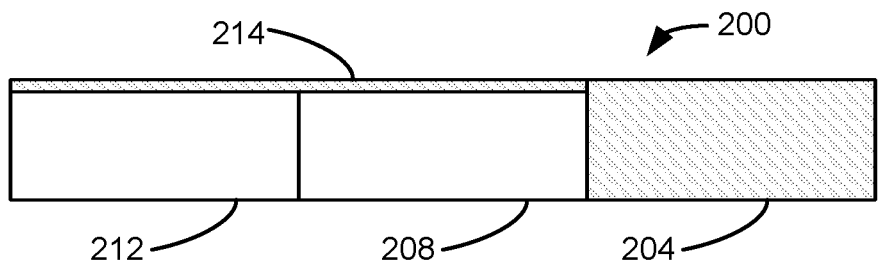
FIGS. 2A-E are schematic cross-sectional views of structures processed according to an embodiment.

Various embodiments provide a high etch selectivity for etching a first region of a semiconductor device with respect to a second region of a semiconductor device. To facilitate understanding, FIG. 1 is a high level flow chart of an embodiment. A structure with a first region and a second region is provided (step 104). FIG. 2A is a schematic cross-sectional view of part of a structure 200 with a $SiO_2$ region 204. In this example, the structure 200 also has a low-k dielectric region 208, and a silicon (Si) region 212. The silicon region 212 may be crystalline or polycrystalline, or amorphous silicon. The low-k dielectric material includes silicon oxynitride (SiON), silicon oxycarbide (SiOC), silicon carbonitride (SiCN), organosilicon oxide (SiOCHx) (back end of line (BEOL) low-k), silicon nitride (SiN), and silicon carbide (SiC). As examples, the low-k dielectric region 208 may have a dielectric constant of no more than 3.0. In some embodiments, the silicon region 212 is silicon based and the $SiO_2$ region 204 is $SiO_2$ based, in that some additives or dopants may be added. In this embodiment, the low-k dielectric material may have components of silicon, nitrogen, carbon, and oxygen. The low-k dielectric region 208 and the Si region 212 are designated as lower oxygen silicon containing regions since they have a lower concentration of oxygen than the silicon oxide regions 204. In this example, the lower oxygen containing region is a second region of the structure 200 and the $SiO_2$ region 204 is the first region of the structure 200. In this embodiment, a native oxide layer 214 is formed over the silicon region 212 and the low-k dielectric region 208.

Figure 2B:
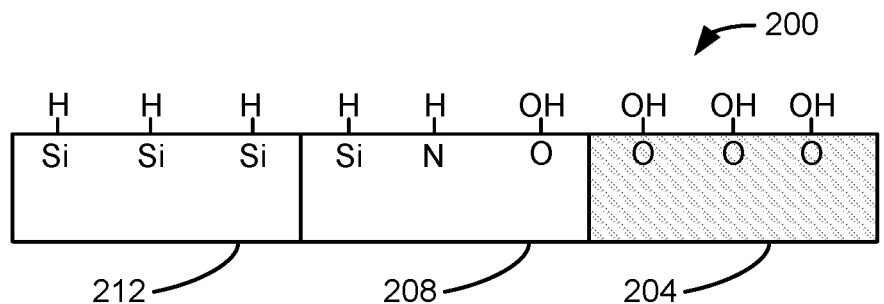

A surface of the structure 200 is conditioned (step 105). In this embodiment, a hydrogen fluoride (HF) clean is provided to remove the native oxide layer 214 and to terminate the surface of the structure 200. In this embodiment, a 0.5% aqueous solution of hydrogen fluoride (HF) is used to wet clean the surface of the structure 200. In other embodiments, the hydrogen fluoride may be a gaseous or aqueous solution. A pre-plasma treatment with argon (Ar), helium (He), or hydrogen ($H_2$) may be used to further clean and activate the low-k dielectric region 208 and Si region 212. FIG. 2B is a schematic cross-sectional view of part of a structure 200 after the surface of the structure 200 is conditioned. The native oxide layer 214, shown in FIG. 2A, has been etched away in FIG. 2B. The oxygen in the $SiO_2$ region 204 forms a hydroxyl-terminated surface, as shown. The silicon in the silicon region 212 forms a hydrogen-terminated silicon surface. In the low-k dielectric region 208, the silicon and nitrogen are hydrogen-terminated and the oxygen is hydroxyl-terminated. Since the low-k dielectric region 208 has a lower concentration of oxygen than the $SiO_2$ region 204, the low-k dielectric region 208 has a lower concentration of hydroxyl terminations than the $SiO_2$ region 204.

After the surface of the structure 200 is conditioned (step 105), an inhibitor layer is selectively deposited on the $SiO_2$ region 204 (step 106). In an embodiment, the surface of the structure 200 is exposed to vapor phase or liquid phase inhibitor deposition. In this example, the inhibitor layer is a self assembled monolayer that selectively binds to the hydroxyl-terminated surface. With vapor phase deposition the typical time frame to establish a full monolayer is in the range of several minutes and up to several days. If a liquid phase is used the time may be shorter but is still in the minute range especially if the time needed for drying the wafer substrate is included.

The deposition of the inhibitor layer in some embodiments provides reactive organosilane compounds like HMDS (hexamethyldisilazane), hexamethyldisilane, tetramethylsilane, ODTS (Octadecyltrichlorosilane), FOTS (1H, 1H, 2H, 2H-Perfluorooctyltrichlorosilane), alkenes (like 1-octadecene, 1-octene, 1-pentene) and N, N-dimethyltrimethylsilylamine (TMS-DMA). In various embodiments, the inhibitor layer may be formed from an inhibitor gas. For example, the inhibitor layer gas may comprise an organosilane gas or vapor with a hydrocarbon chain with a length between 1-20 carbon atoms. In various embodiments, the inhibitor layer gas may comprise at least one of an organochlorosilane, organoamidosilane, or an organoalkoxysilane. In some embodiments, the inhibitor layer gas may comprise a gas or vapor of a partially fluorinated hydrocarbon chain. In some embodiments, the structure is placed on a heated pedestal. The pedestal may heat the structure to a temperature greater than 100° C.

Figure 2C:
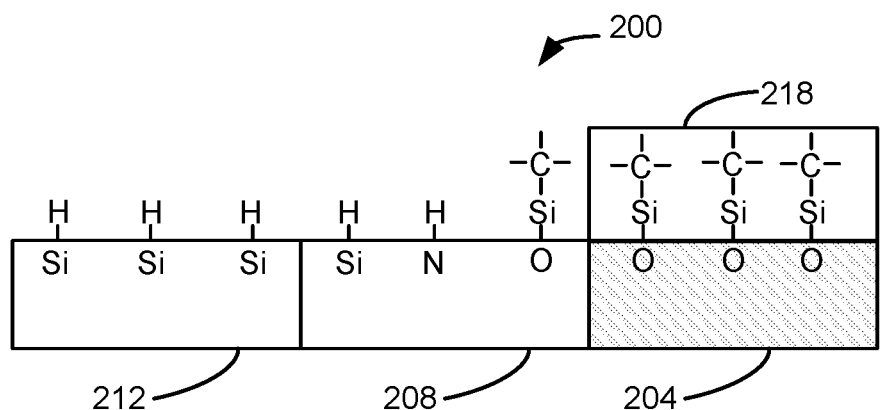

An inhibitor gas may be introduced by flowing the gas over the wafer. In this embodiment, the inhibitor gas is 10-1000 sccm HMDS. The HMDS flow can be maintained from 10 seconds to 30 minutes. In this embodiment, a thermal activation is used to deposit an inhibitor layer. The inhibitor vapor reacts with hydroxyl groups to selectively deposit a self assembled monolayer on the $SiO_2$ region 204. The inhibitor vapor may be diluted with other carrier gases such as 10-1000 sccm argon (Ar), helium (He), nitrogen ($N_2$), neon (Ne), xenon (Xe), or hydrogen ($H_2$). In other embodiments, the inhibitor gas may be flowed into the chamber and then the chamber valve can be closed to saturate by increasing HMDS vapor exposure. FIG. 2C is a schematic cross-sectional view of part of a structure 200 after an inhibitor layer 218 has been selectively deposited over the silicon oxide region 204. The conditioning of the surface (step 105) has increased the selectivity of the deposition of the inhibitor layer on the first region of the structure with respect to the second region of the structure.

In the above embodiment, the deposition of the inhibitor layer is a relatively slow process that may take minutes or hours. In order to increase throughput, various embodiments transform the inhibitor gas into inhibitor gas radicals. Radicals are atoms, molecules, or ions that have an unpaired valence electron causing the atoms, molecules, or ions to be highly chemically reactive. To transform the inhibitor gas into inhibitor radicals, excitation energy is applied to provide the unpaired valance electron by adding or removing an electron. In various embodiments, the energy may be provided by a pulse of RF energy for a pulsed plasma, remote plasma energy, ultraviolet (UV) energy, or by filament hot wire energy.

In an embodiment, the inhibitor gas may be flowed into the chamber and saturate the chamber. The gas flow is stopped and a plasma is ignited for 10-1000 milliseconds (ms) and with a radio frequency (RF) power pulse with a power between 50 watts and 500 watts for a period between 10 ms to 1000 ms. The pulse RF power enables a self limiting process that limits the thickness of the inhibitor layer to a monolayer with a thickness of 1-2 nm depending on the inhibitor molecule size. In the first 100 ms, the self assembled monolayer is formed, and after self assembled monolayer is saturated the deposition is inhibited. This self limiting characteristic has not been achieved before with a plasma process. This embodiment enables the reduction of deposition time to less than 1 s. Such a short deposition time is not possible with a gas phase only process. In other embodiments, the inhibitor vapor may be diluted with other carrier gases such as 10-1000 sccm Ar, He, Ne, Xe, $N_2$, or $H_2$.

In various embodiments, good control over the energy of the radicals is necessary to increase the speed of deposition but prevent continuous deposition. In an example, a pulsed low power plasma in the range of 50-300 watts (W) with a duty cycle of <50% is provided. In some embodiments, the temperature of the structure during the deposition of the inhibitor layer radicals (step 106) is kept above 100° C. to reduce the adsorption of molecules that are not radicals. In an embodiment using a remote plasma, the inhibitor gas is exposed to plasma energy at a remote location. The remoteness of the plasma may provide a control knob.

If the inhibitor layer gas is not formed into radicals, the deposition of a monolayer of the inhibitor layer may take more than 1 minute and may take as long as hours or days. In trying to increase the deposition speed by increasing pressure and temperatures without forming radicals, the ability to form monolayers is lost. By forming radicals from the inhibitor layer gas the deposition of a monolayer of the inhibitor layer may be performed in less than about 200 milliseconds. If a regular plasma process is used the deposition would not be self limiting and result in continuous growth.

Choosing an appropriate pre-treatment enables the selective deposition of the inhibitor layer by differentiating the materials based on the density of reactive sites. The pre-treatment can enhance reactive sites by activation. In other embodiments, the inhibitor layer may be provided by self assembled monolayers of polymer or carbon based inhibitors. In various embodiments, conditioning the surface may use ammonia ($NH_3$), hydrazine ($N_2H_4$), hydrogen ($H_2$), water ($H_2O$), peroxide ($H_2O_2$), oxygen ($O_2$), ozone ($O_3$), and vapor phase reactions.

After the inhibitor layer has been deposited (step 106), a sacrificial mask is selectively deposited on the lower oxygen silicon containing regions with respect to the $SiO_2$ region 204 (step 108). In this embodiment, an atomic layer deposition (ALD) process is used to provide a metal containing sacrificial mask, where the inhibitor layer 218 inhibits deposition on the $SiO_2$ region 204. The selective deposition may be performed in one or more cycles. For instance, in this embodiment, the selective deposition of the sacrificial mask (step 108) comprises a plurality of cycles of a metal precursor deposition step (step 110) and a reactant step (step 112) to provide the selective atomic layer deposition process. In some embodiments, a purge is provided between the metal precursor deposition step (step 110) and the reactant step (step 112).

In an embodiment, the at least one of metal oxide, metal carbide, and metal nitride is a titanium dioxide deposited by a thermal ALD process. A cyclic process between a Ti containing precursor (step 110) and an oxidizer, as a reactant, (step 112) is used to deposit the titanium dioxide. The Ti pre-cursor can be titanium(IV) isopropoxide, tetrakis(diethylamido)titanium(IV), tetrakis(dimethylamido)titanium(IV), tetrakis(ethylmethylamido)titanium(IV), titanium tetrachloride. The surface of the structure 200 is exposed to the Ti containing precursor in order to deposit a metal containing precursor layer (step 110).

Figure 2D:
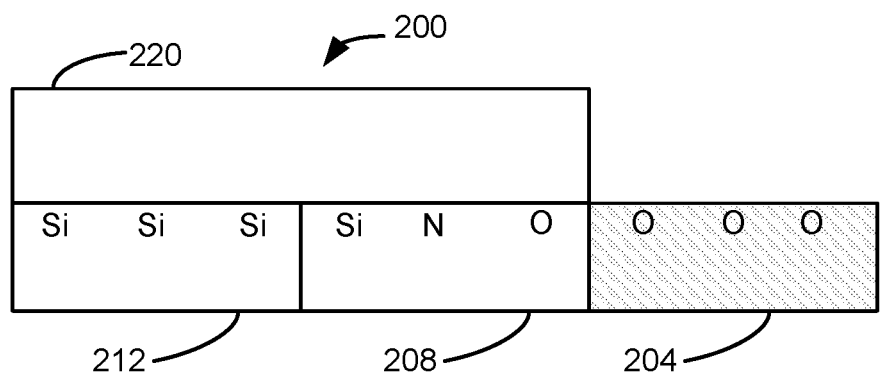

After the metal containing precursor layer has been selectively deposited on the low-k dielectric region 208 and the Si region 212 (step 110), a reactant is provided to form the metal containing precursor layer into a metal containing layer such as a metal oxide, metal carbide, or metal nitride provided in a reactant step (step 112). In various embodiments, the reactant may be an oxygen containing reactant, a nitrogen containing reactant, or a carbon containing reactant. In various embodiments, the reactant may be oxygen gas, water vapor, nitrogen gas, and hydrogen gas. In this embodiment, the metal containing precursor layer is oxidized using an oxidizer. Example oxidizers may include water ($H_2O$) vapor, oxygen ($O_2$), peroxide ($H_2O_2$), or ozone ($O_3$). FIG. 2D is a schematic cross-sectional view of part of a structure 200 after sacrificial mask 220 has been selectively deposited over the structure 200. In this embodiment, the deposition of the sacrificial mask 220 removes the inhibitor layer 218, shown in FIG. 2C.

The selective deposition of the inhibitor reduces deposition of the metal containing layer on the $SiO_2$ region 204, so that more metal oxide, metal carbide, or metal nitride is deposited on the low-k dielectric region 208 and the Si region 212. The surface density of the inhibitor film determines how long the deposition is prevented. The partial deposition of the inhibitor on the low-k dielectric region 208 and Si region 212 allows earlier growth of at least one of metal oxide, metal carbide, or metal nitride compared to the full inhibitor layer on $SiO_2$ region 204.

In other embodiments, the metal containing precursors may contain tungsten (W), molybdenum (Mo), titanium (Ti), zirconium (Zr), hafnium (Hf), antimony (Sb), vanadium (V), tantalum (Ta), aluminum (Al), yttrium (Y), or nickel (Ni). In various embodiments, that at least one metal oxide, metal carbide, or metal nitride sacrificial mask may be at least one of titanium dioxide ($TiO_2$), zirconium dioxide ($ZrO_2$), hafnium dioxide ($HfO_2$), tungsten oxide ($WO_3$), molybdenum oxide ($MoO_3$), antimony ($Sb_2O_3$), vanadium oxide ($V_2O_3$), yttria ($Y_2O_3$), tantalum oxide ($Ta_2O_5$), or aluminum oxide ($Al_2O_3$).

In various embodiments, a sacrificial mask of $HfO_2$ is used. In such an embodiment, a Hf containing precursor and an oxidizer, as a reactant are used to deposit the hafnium dioxide. The Hf containing precursor can be at least one of hafnium(IV) tert-butoxide, tetrakis(diethylamido) hafnium (IV), tetrakis(dimethylamido) hafnium (IV), tetrakis(ethylmethylamido) hafnium (IV), hafnium tetrachloride. Etch selectivity of $HfO_2$ and $TiO_2$ to $SiO_2$ is 30:1 and 5:1, respectively. The oxidizer can be one or more of water ($H_2O$) vapor, oxygen ($O_2$), peroxide ($H_2O_2$), or ozone ($O_3$). In various embodiments, where the sacrificial layer is a metal nitride, the reactant may be at least one of ammonia ($NH_3$), hydrazine ($N_2H_4$) In other embodiments, where the sacrificial layer is a metal carbide, the reactant may be at least one of methane ($CH_4$), ethylene ($C_2H_4$) and acetylene ($C_2H_4$).

In other embodiments, a sacrificial mask of $ZrO_2$ is used. In such embodiments, a Zr containing precursor and an oxidizer, as a reactant are used to deposit the $ZrO_2$. The Zr containing precursor can be at least one of zirconium (IV) tert-butoxide, tetrakis(diethylamido) zirconium (IV), tetrakis(dimethylamido) zirconium (IV), tetrakis(ethylmethylamido) zirconium (IV), zirconium tetrachloride. The oxidizer can be one or more of water ($H_2O$) vapor, oxygen ($O_2$), peroxide ($H_2O_2$), or ozone ($O_3$).

After the mask is selectively deposited (step 108), a dedicated defect control step may optionally be used to clean up any residual metal oxide on the silicon oxide surface. This can be a boron trichloride ($BCl_3$) based plasma process using a defect control gas of 5-100 standard cubic centimeters per minute (sccm), $BCl_3$, 50-300 sccm chlorine ($Cl_2$), and 0-500 sccm helium (He) at a pressure of 5-150 milliTorr. RF power is provided at 100-500 watts. A bias of 0-50 volts is provided.

Figure 2E:
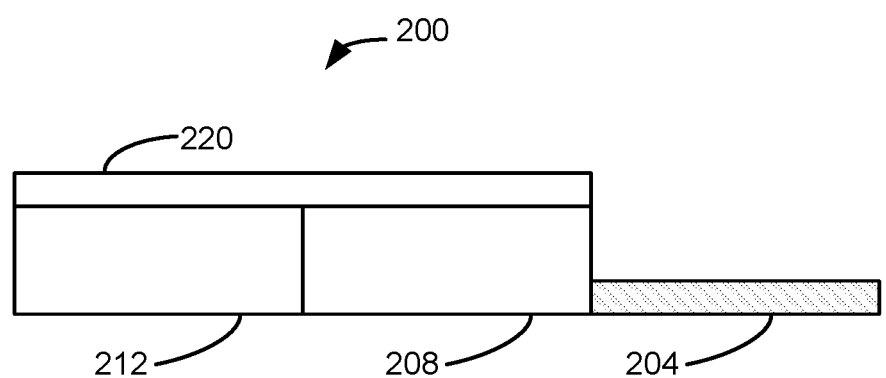

After the mask is selectively deposited (step 108), an atomic layer etch (ALE) is used to selectively etch the $SiO_2$ region 204 with respect to the silicon region 212 and the low-k dielectric region 208 (step 120). In this embodiment, the atomic layer etch provides a reactant gas of fluorocarbon such as hexafluoro-2-butyne ($C_4F_6$) or octafluorocyclobutane ($C_4F_8$). The fluorocarbon selectively forms a deposition layer over the $SiO_2$ region 204. The reactant gas is purged and an activation gas of Ar is provided. The Ar activates the deposition layer causing deposited fluorine to etch the $SiO_2$ region 204. The atomic layer etch process may be repeated for a plurality of cycles. Whether the process needs to be repeated may be determined based on any of a number of factors. For instance, if the sacrificial mask 220 is removed before the etching of the $SiO_2$ region 204 is complete, at step 124 the process may go back to the selective deposition of the inhibitor layer (step 106). When the etching of the $SiO_2$ region 204 is complete (step 124) the process is stopped. FIG. 2E is a schematic cross-sectional view of part of a structure 200 after an atomic layer etch of the $SiO_2$ region is has been completed. The $SiO_2$ region 204 is selectively etched with respect to the low-k dielectric region 208 and the Si region 212 with a very high selectivity. In this embodiment, the selectivity of the etch of the $SiO_2$ region with respect to the low-k dielectric region 208 and the Si region 212 is expected to be greater than 20:1.

Various embodiments provide a surface treatment that enhances the selective nucleation delay. The surface treatment may include an inhibitor layer. Various embodiments provide material selective deposition of a sacrificial mask.

Various embodiments provide defect control on an open area of the sacrificial mask. Various embodiments provide a selective etch of the underlying material of the open area of the sacrificial mask.

In other embodiments, a method for selectively etching SiOCN or a metal oxide with a hydroxyl(OH) surface termination with respect to a lower oxygen containing region like a silicon or a silicon nitride (SiN) region is provided. An inhibitor layer is selectively deposited on the higher oxygen containing region with respect to the silicon or SiN region using inhibitor layer radicals. A sacrificial mask is selectively deposited on the lower oxygen containing region, because of the inhibitor layer. The higher oxygen containing region is selectively etched with respect to the sacrificial mask on the lower oxygen containing region. Other embodiments may be used to selectively etch aluminum oxide with respect to silicon nitride by using the higher oxygen concentration in aluminum oxide.

Figure 3:
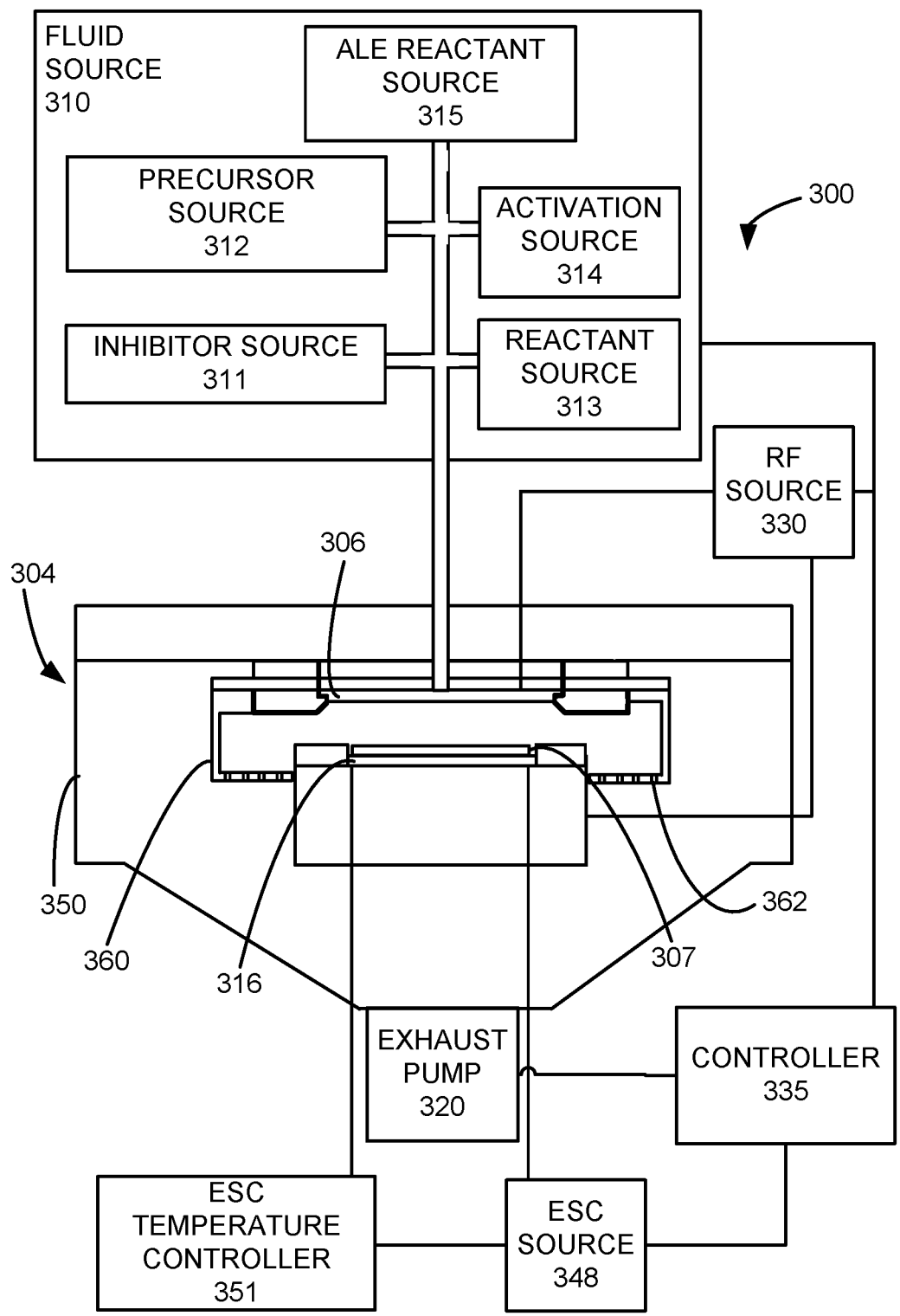
FIG. 3 is a schematic view of a plasma etching chamber that may be used in an embodiment.

In some embodiments, the selectively depositing the inhibitor layer radicals (step 106), the depositing the sacrificial mask (step 108), and/or the selectively etching (step 120) are performed in-situ. FIG. 3 is a schematic view of a plasma etching system 300 for plasma processing substrates, in which the component may be installed in an embodiment. In one or more embodiments, the plasma etching system 300 comprises a showerhead electrode 306 providing gas inlet and an electrostatic chuck (ESC) 316, within a plasma processing chamber 304, enclosed by a chamber wall 350. Within the plasma processing chamber 304, a substrate 307 is positioned on top of the ESC 316. The ESC 316 may provide a bias from an ESC power source 348.

A fluid source 310 is connected to the plasma processing chamber 304 through the showerhead electrode 306. In this embodiment, the fluid source 310 comprises an inhibitor source 311, a precursor source 312, a reactant source 313, and activation source 314, and an ALE reactant source. In other embodiments, the fluid source 310 may further comprise other fluid sources, such as a conditioning gas source and a purge gas source.

An ESC temperature controller 351 is connected to the ESC 316 and provides temperature control of the ESC 316. A radio frequency (RF) power source 330 provides RF power to the ESC 316 and an upper electrode. In this embodiment, the upper electrode is the showerhead electrode 306. In a preferred embodiment, 13.56 megahertz (MHz), 2 MHz, 60 MHz, and/or optionally, 27 MHz power sources make up the RF power source 330 and the ESC power source 348. A controller 335 is controllably connected to the RF power source 330, the ESC power source 348, an exhaust pump 320, and the fluid source 310. A high flow liner 360 is a liner within the plasma processing chamber 304, which confines gas from the fluid source 310 and has slots 362. The slots 362 maintain a controlled flow of gas to pass from the fluid source 310 to the exhaust pump 320. An example of such a plasma processing chamber is the Flex®etch system manufactured by Lam Research Corporation of Fremont, Calif. In such a plasma processing chamber 304, the structure may be provided into the plasma processing chamber 304 (step 104) and all of the steps 104 to 124 may be performed in-situ.

Figure 4:
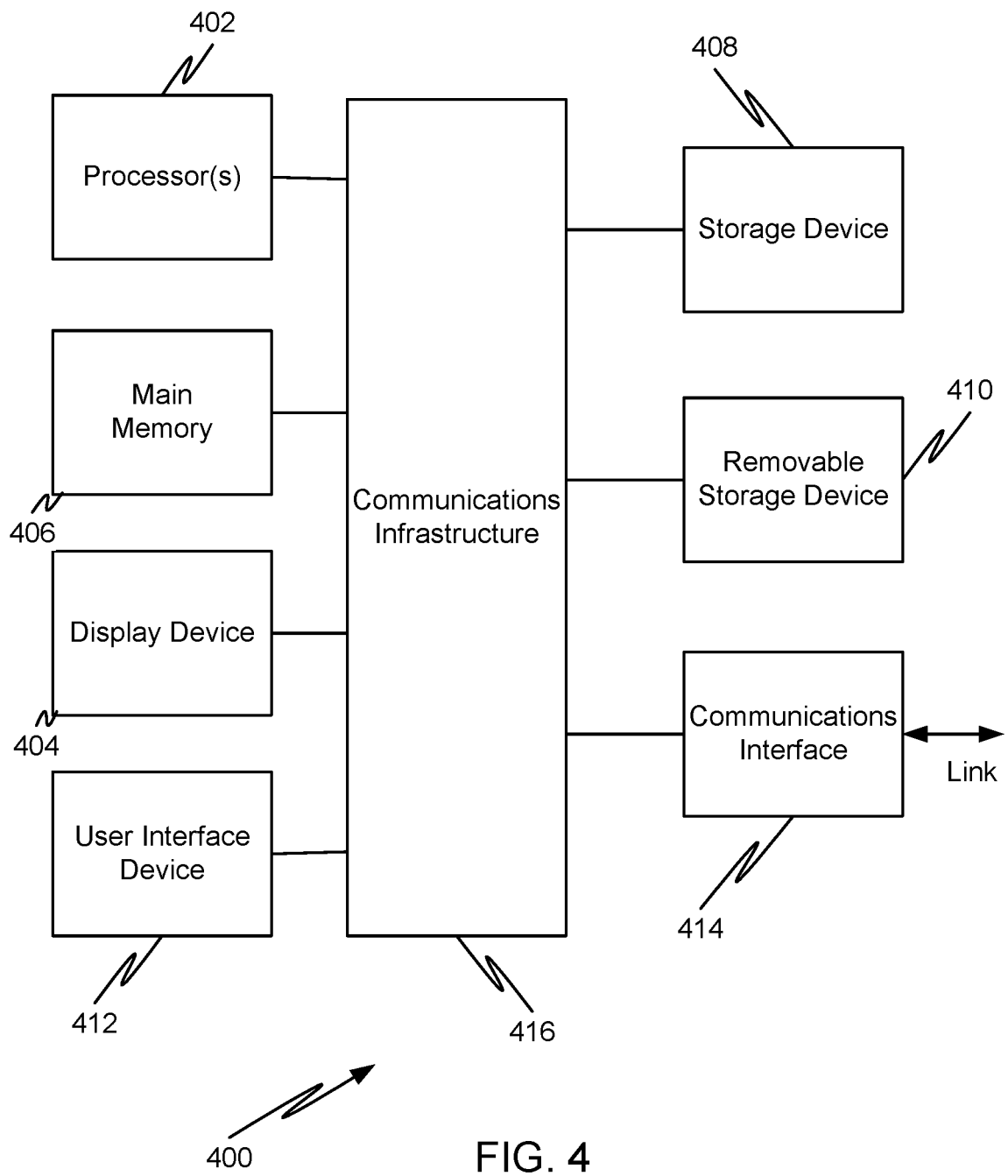
FIG. 4 is a schematic view of a computer system that may be used in practicing an embodiment.

FIG. 4 is a high level block diagram showing a computer system 400, which is suitable for implementing the controller 335 in FIG. 3 used in embodiments. The computer system may have many physical forms ranging from an integrated circuit, a printed circuit board, and a small handheld device up to a huge supercomputer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communications interface 414 (e.g., wireless network interface). The communications interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable media" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Such computer readable media may contain computer readable code for conditioning the surface (step 105). The computer readable media may further comprise computer readable code for selectively depositing the inhibitor layer (step 106) comprising providing an inhibitor layer gas from the inhibitor source 311 and forming the inhibitor layer gas into inhibitor layer radicals. The formation of the inhibitor layer radicals may be accomplished with computer readable code for providing pulsed energy from the RF power source 330. The computer readable media may further comprise computer readable code for selectively depositing the sacrificial mask (step 108) comprising computer readable code for providing a plurality of cycles of providing a precursor fluid from the precursor source 312 (step 110) and then providing a reactant gas from the reactant source 313 (step 112). The computer readable media further comprises computer readable code for providing a selective etch (step 120). The computer readable code for providing a selective etch (step 120) comprises computer readable code for providing a plurality of cycles of providing an ALE reactant gas from the ALE reactant source 315 and providing an activation gas from the activation source 314.

In other embodiments, other plasma processing systems may be used. For example, an inductively coupled plasma system may be used in other embodiments. Examples of plasma processing systems that may perform embodiments in-situ is a Kiyo® system, a Syndion® system, and a Selis® chamber all by Lam Research of Fremont, Calif.

While this disclosure has been described in terms of several exemplary embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for selectively etching a first region of a structure with respect to a second region of the structure, the method comprising at least one cycle, wherein each cycle comprises:
    selectively depositing an inhibitor layer on the first region of the structure, comprising:
        providing an inhibitor layer gas; and
        forming the inhibitor layer gas into inhibitor layer radicals, wherein the inhibitor layer radicals selectively deposit on the first region of the structure with respect to the second region of the structure;
    providing an atomic layer deposition over the structure, wherein the atomic layer deposition selectively deposits a mask on the second region of the structure with respect to the inhibitor layer; and
    selectively etching the first region of the structure with respect to the mask.

2. The method, as recited in claim 1, further comprising conditioning the first region of the structure to increase selectivity of deposition of the inhibitor layer radicals on the first region of the structure with respect to the second region of the structure.

3. The method, as recited in claim 1, wherein the inhibitor layer radicals form a self assembled monolayer.

4. The method, as recited in claim 1, wherein the inhibitor layer gas comprises a gas or vapor of at least one of an organochlorosilane, an organoamidosilane, or an organoalkoxysilane.

5. The method, as recited in claim 4, further comprising heating the structure to a temperature above 100° C.

6. The method, as recited in claim 4, further comprising providing the inhibitor layer gas at a pressure in a range of 5 mTorr to 5000 mTorr.

7. The method, as recited in claim 4, wherein the forming the inhibitor layer gas into the inhibitor layer radicals is for a period of 10 ms to 1000 ms.

8. The method, as recited in claim 1, wherein the forming the inhibitor layer gas into the inhibitor layer radicals, comprises exposing the inhibitor layer gas to plasma energy at a location remote from the structure.

9. The method, as recited in claim 1, wherein the selectively depositing the inhibitor layer, the providing the atomic layer deposition, and the selectively etching are performed in-situ.

10. The method, as recited in claim 1, wherein the inhibitor layer gas comprises a gas or vapor of at least one of HMDS, hexamethyldisilane, tetramethylsilane, ODTS, FOTS, alkenes, and TMS-DMA.

11. The method, as recited in claim 1, wherein the inhibitor layer gas comprises an organosilane gas or vapor with a hydrocarbon chain with a length between 1-20 carbon atoms.

12. The method, as recited in claim 1, wherein the inhibitor layer gas comprises an organosilane gas or vapor with a partially fluorinated hydrocarbon chain.

13. The method, as recited in claim 1, wherein the first region has a higher atomic concentration of oxygen than the second region.

14. The method, as recited in claim 13, wherein the first region is of a silicon oxide based material.

15. The method, as recited in claim 14, wherein the second region comprises at least one of a silicon based region or a low-k dielectric region.

16. The method, as recited in claim 1, wherein the forming the inhibitor layer gas into the inhibitor layer radicals, comprises exposing the inhibitor layer gas to UV energy.

17. The method, as recited in claim 1, wherein the forming the inhibitor layer gas into the inhibitor layer radicals comprises exposing the inhibitor layer gas to a filament hot wire that provides sufficient energy to form the inhibitor layer gas into inhibitor layer radicals.

18. The method, as recited in claim 1, wherein the forming the inhibitor layer gas into the inhibitor layer radicals comprises an RF pulse power for a period in a range of about 10 ms to 1000 ms.

19. The method, as recited in claim 1, wherein the providing an atomic layer deposition over the structure forms a metal containing sacrificial mask.

20. The method, as recited in claim 1, further comprising:
    determining whether the mask is removed before the etching of the first region is complete, wherein repeating the cycle for one or more times is based on the determination.

* * * * *